(12) United States Patent
Cabrera et al.

(10) Patent No.: US 8,835,861 B1
(45) Date of Patent: Sep. 16, 2014

(54) MICROACTUATORS BASED ON INSULATOR-TO-METAL TRANSITION MATERIALS AND METHOD OF USING THE SAME

(75) Inventors: Rafmag Cabrera, San Juan, PR (US); Felix E. Fernandez, Mayaguez, PR (US); Armando Rua, Yauco, PR (US); Nelson Sepulveda, Mayaguez, PR (US)

(73) Assignee: University of Puerto Rico, San Juan, PR (US)

( * ) Notice: Subject to any disclaimer, the term of this patent is extended or adjusted under 35 U.S.C. 154(b) by 782 days.

(21) Appl. No.: 13/070,506

(22) Filed: Mar. 24, 2011

Related U.S. Application Data

(63) Continuation-in-part of application No. 12/660,933, filed on Mar. 5, 2010, now Pat. No. 8,440,973.

(60) Provisional application No. 61/317,098, filed on Mar. 24, 2010.

(51) Int. Cl.
*H01L 29/66* (2006.01)
*G01J 5/20* (2006.01)

(52) U.S. Cl.
USPC ............. 250/370.01; 250/338.4; 257/415

(58) Field of Classification Search
USPC ......... 250/332, 338.1, 338.4, 339.01, 339.02, 250/339.04, 370.01; 257/415, 467
See application file for complete search history.

(56) References Cited

U.S. PATENT DOCUMENTS

| 6,835,932 B2* | 12/2004 | Ishizuya et al. ............ 250/338.1 |
| 7,741,603 B2* | 6/2010 | Simelgor et al. ............ 250/338.1 |
| 7,755,049 B2* | 7/2010 | Simelgor et al. .......... 250/339.03 |
| 8,130,072 B2* | 3/2012 | De Bruyker et al. ....... 338/22 R |
| 2009/0051920 A1* | 2/2009 | Hyde ............................ 356/445 |

* cited by examiner

*Primary Examiner* — Mark R Gaworecki
(74) *Attorney, Agent, or Firm* — Hoglund & Pamias, P.S.C.; Roberto J. Rios

(57) ABSTRACT

The invention utilizes the changes in physical properties of materials during a solid-solid phase transition in order to actuate microactuators. The substantial changes in properties during insulator-to-metal transitions (IMTs) of some materials are useful for controlling purposes. Methods of using the microactuators are also explained.

19 Claims, 14 Drawing Sheets

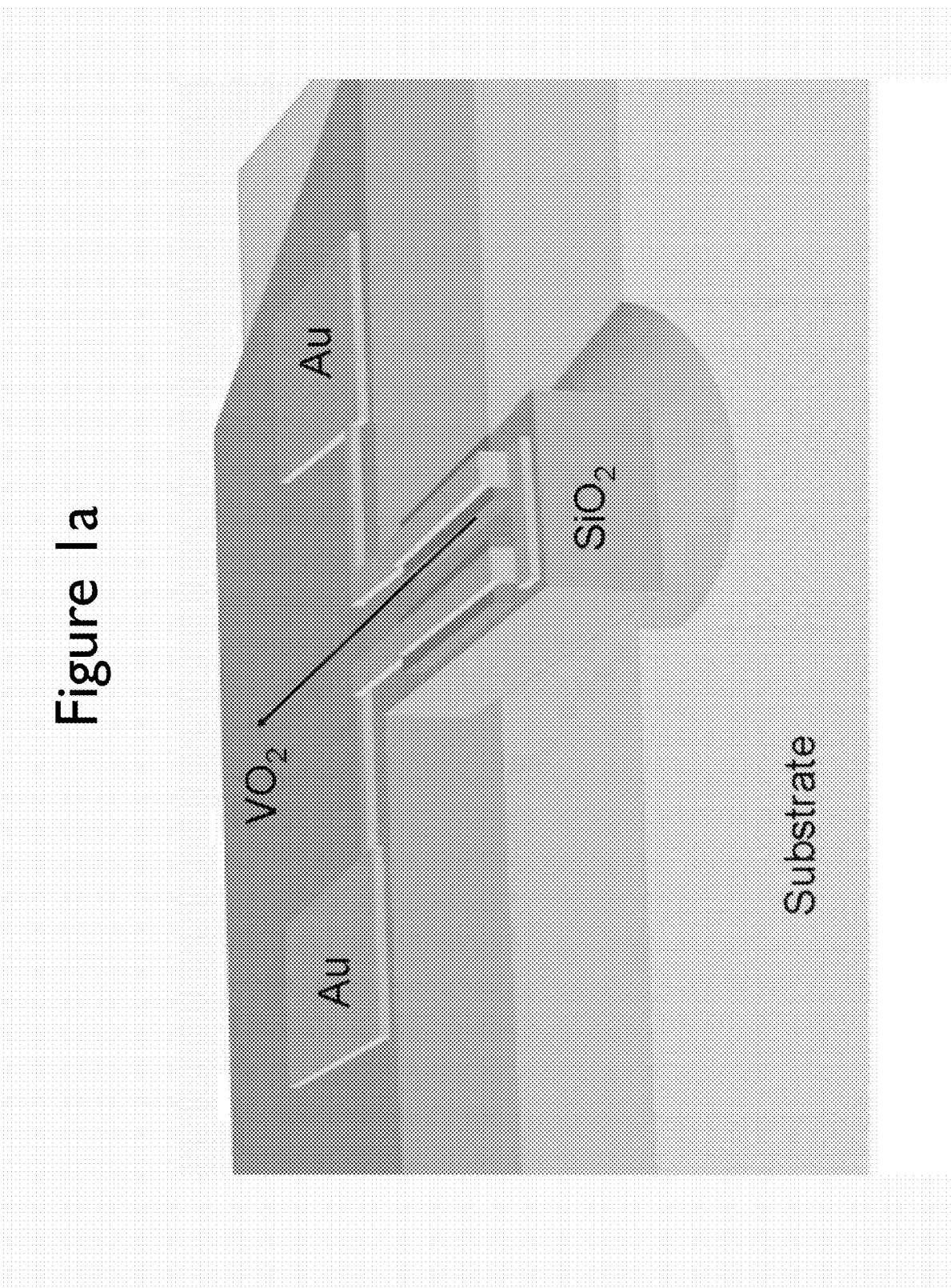

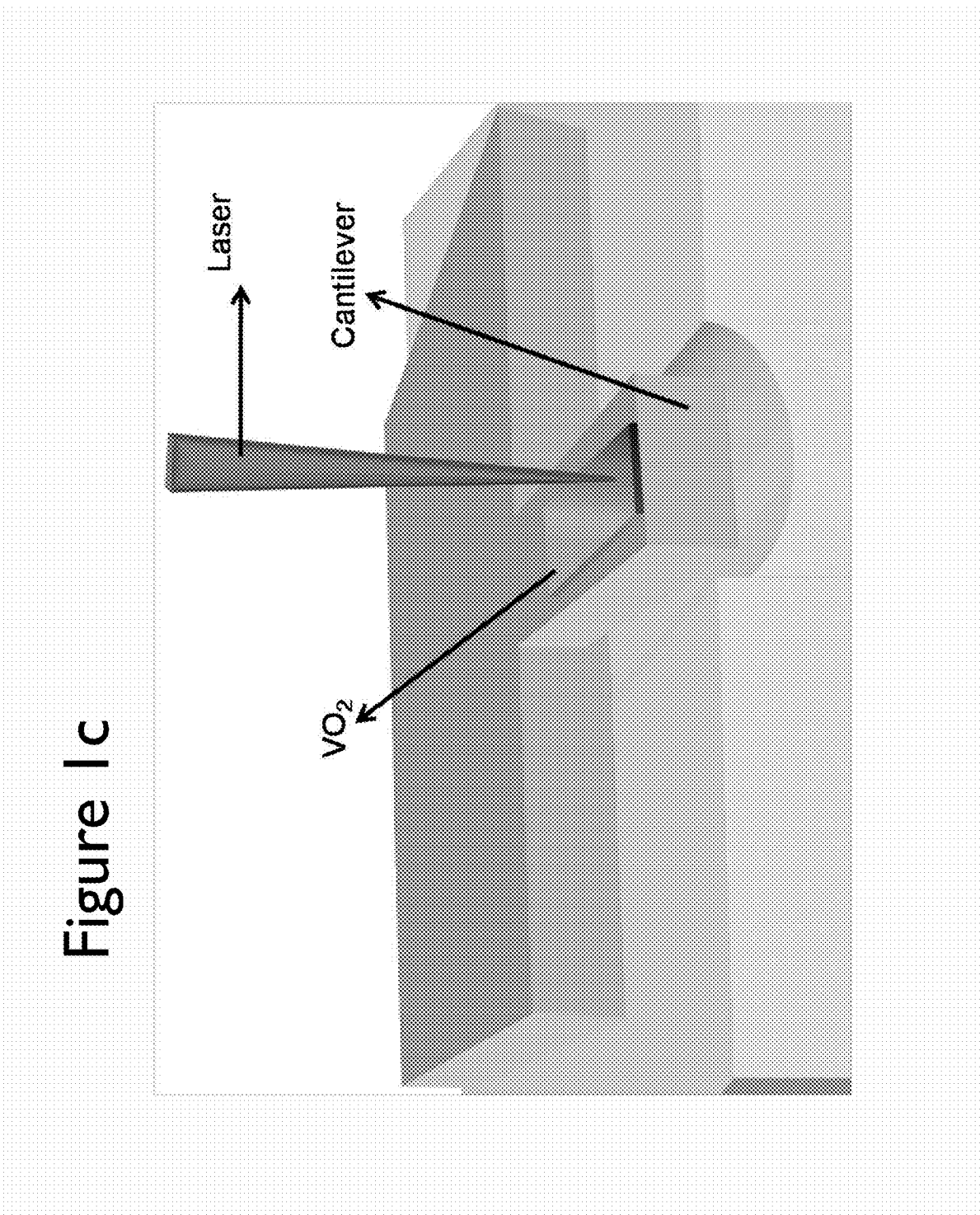

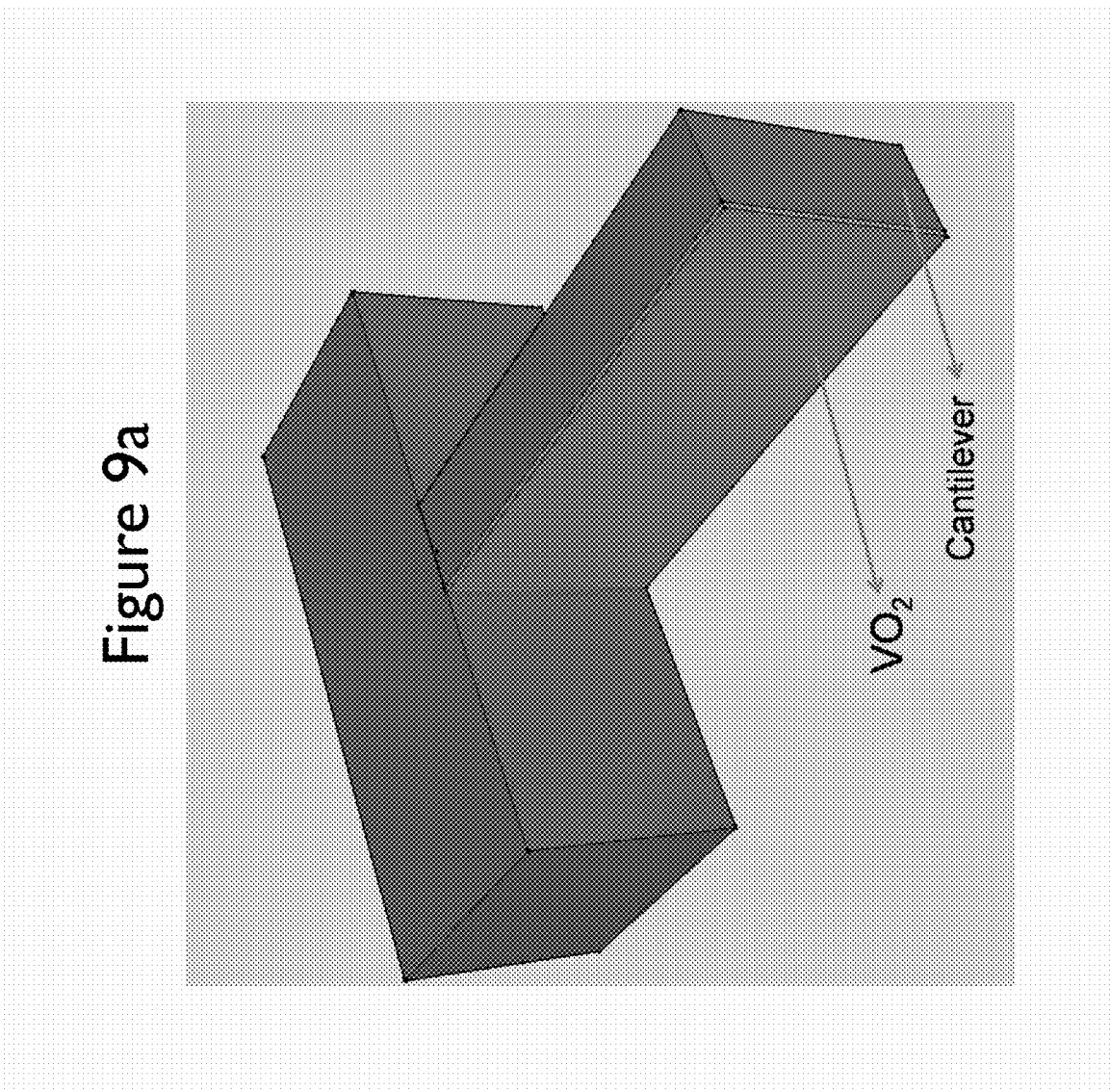

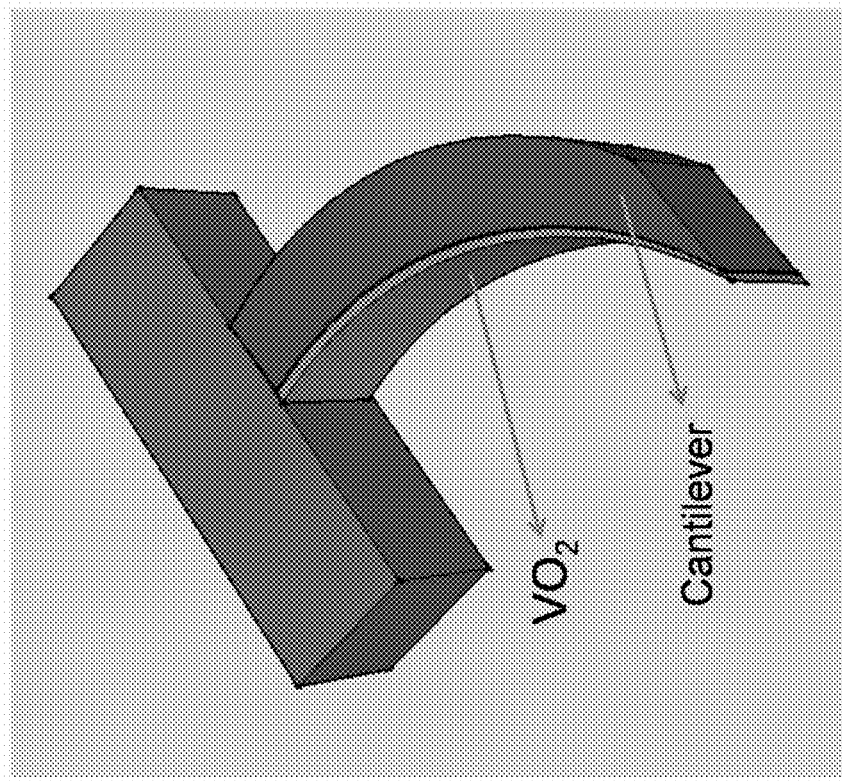

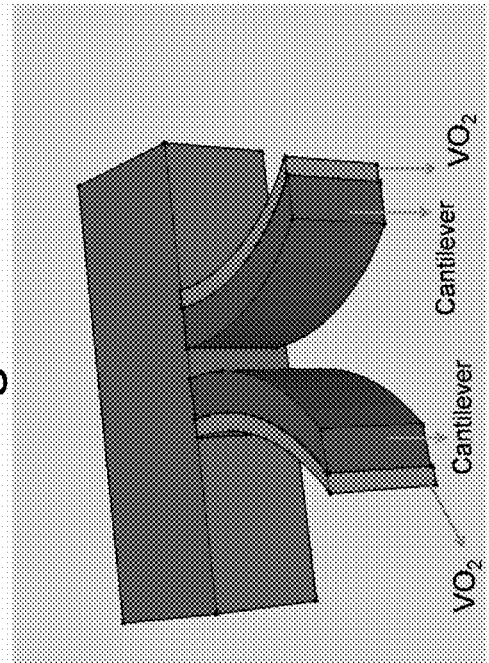
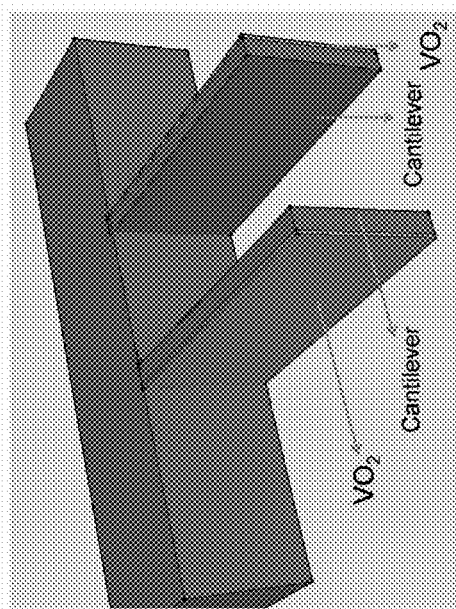
Figure 9c
Figure 9d

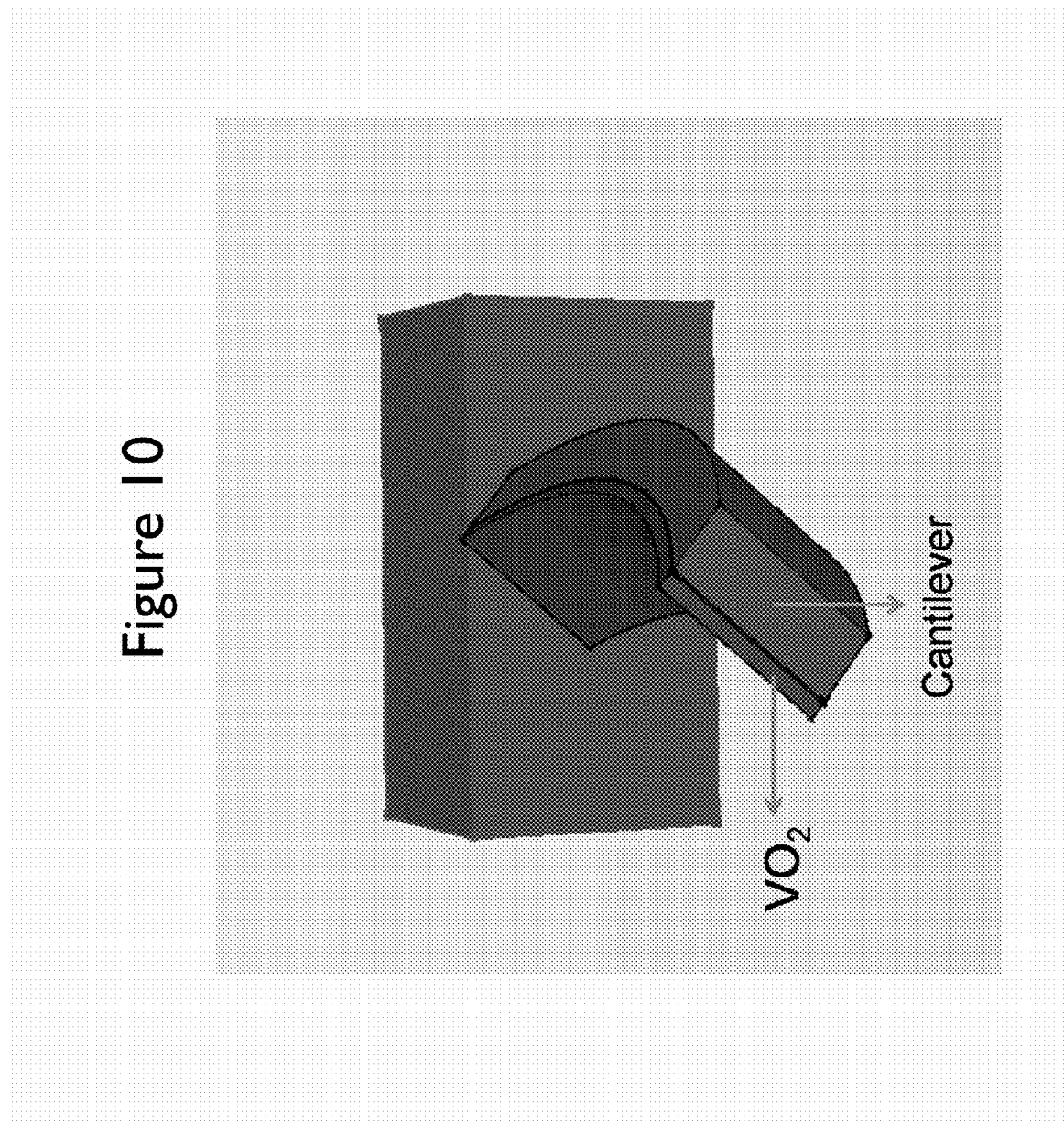

MICROACTUATORS BASED ON INSULATOR-TO-METAL TRANSITION MATERIALS AND METHOD OF USING THE SAME

CROSS-REFERENCE TO RELATED APPLICATIONS

This application is a continuation-in-part of U.S. patent application Ser. No. 12/660,933, filed on Mar. 5, 2010, still pending. The entirety of this application is incorporated herein by reference.

BACKGROUND OF THE INVENTION

Actuators that can effect controlled motion in the micron or sub-micron ranges are essential components of micro-electromechanical or nano-electromechanical systems (MEMS or NEMS, respectively). In most cases, the output of an actuator is the displacement of a miniaturized suspended structure (e.g.: cantilever, membrane, rotating gear), and a variety of effects (electrostatic, piezoelectric, thermal, and magnetic) have been used successfully to transduce an input signal (usually electrical) into controllable mechanical motion. Each transducing mechanism can have advantages and disadvantages in terms of design and fabrication simplicity, control accuracy (resolution), efficiency, practical limits to motion range, and maximum operation frequency. Hence, because there is such a wide range of applications for electromechanical actuators there is no single type that is best suited for all cases. The present invention is particularly relevant for situations in which the magnitude of forces to be applied or work to be performed by the actuator is not negligible. Also, it is emphasized that only microscale applications (MEMS and NEMS) are considered in the following. Whenever the operating principles of macro actuators can be applied in scaled down versions these are also relevant. However, some of these—as for hydraulic actuators, for example—are difficult or impossible to implement in microdevices. Furthermore, the cases of higher interest here are those in which on-chip integration is feasible.

Typically, electromagnetic and magnetostatic microactuators have low output forces and displacements. This is due to the fact that the forces induced by magnetic fields scale down very rapidly with size. The prior art has reported currents of 80 mA that have generated 200 µN of actuation force and bending displacements of 50 µm. The size of such device was about 8 mm². Another spiral-type magnetic microactuator has been reported of being capable of producing forces of 1.24 mN, with displacements up to 28 µm. However, this device still had dimensions in the millimeter range. An additional limitation is that electromagnetic and magnetostatic actuators usually need an excitation source external to the chip where the device is located, impeding their complete integration into one single chip.

Micrometer sized electrostatic actuators use the attractive or repelling force between two changed plates or surfaces. These can sustain very high electric fields when fabricated in the micrometer scale, since the gaps between the charged surfaces can be smaller than the mean free path of electrons in air at room temperature (~6 µm). Electrostatic comb-drives have been actuated with 20 V and achieved displacements close to 30 µm. Later improvements in the design and fabrication led to displacements of up to 150 µm in 1 ms on comb-drive devices actuated with 150 V. Combdrives are usually the type of devices used for actuating micro engines. Although relatively large torqueses have been delivered, because the gear movement is rotational (angular motion), the linear displacements have been close to 40 µm. However, other types of electrostatic actuators, such as scratch drives and impact actuators can be used to obtain deflections as large as 200 µm. Impact actuators need multiple motions (or impacts) in order to produce a total displacement in the micrometer range, and total device sizes are several mm. Scratch drive actuators are also usually operated by an AC voltage and can supply forces close to 1 mN and have displacements close to 200 µm.

Piezoelectric actuators can produce forces up to ~1 mN and displacements up to ~200 µm, although due to materials characteristics a compromise between high forces and long displacements must be made. Mechanically amplified piezoelectric actuators can provide displacements up to 1.2 mm, but at the cost of reduced usable force. Also, piezoelectric actuators that can provide such large displacements have dimensions in the millimeter range. A clear advantage of piezoelectrics is their capability for very fast response, which extends to nearly 10 kHz, and can be increased by up to two orders of magnitude in piezoelectric "bimorph" cantilever geometries—albeit with a substantial reduction in the useful force. One disadvantage of piezoelectric actuators is that materials with optimal characteristics are themselves relatively complex compounds, which may not be easily deposited as thin films with standard microfabrication technology. Another difficulty is the need for relatively high operation voltages, which can hinder applicability in MEMS and NEMS.

The family of thermal actuators can be divided in several classes according to the phenomenon caused by the change in temperature. Some of these, such as thermopneumatics, require relatively complex fabrication and operation and are less suitable for miniaturization and on-chip integration. In this regard, the most promising classes of thermal actuators for integration in MEMS and NEMS, and able to provide adequate forces and displacements in at least a variety of applications are those based on solid expansion, particularly trough differences in thermal expansion, and on the shape memory effect. The latter is due to a reversible martensitic transformation occurring in alloys such as Ni—Ti, and is the mechanism behind shape memory alloy (SMA) actuators. Among all the types of mechanical actuators they currently offer the highest work per unit volume. Many SMA materials are relatively easy to deposit as thin films with standard techniques, which simplifies their application in microdevices. Over a decade ago the dimensions of the smallest SMA-based devices were in the millimeter range and their reported displacements were not larger than 35 µm. However, in recent years smaller devices capable of displacements of over 100 µm have been demonstrated.

The other main class of thermal actuators suitable for miniaturization and large-scale integration uses the mechanism of thermal expansion coefficient differential (TECD) of two materials ($\Delta\alpha=\alpha_a-\alpha_b$). These actuators are basically released structures (e.g., cantilevers) made out of at least two different materials with different thermal expansion coefficients ($\alpha_a$, $\alpha_b$). When heated, the difference in the thermal expansion coefficients causes the layers to expand at different rates. The stress developed causes the cantilever to bend in a direction perpendicular to the plane of the layers, with the layer with the lowest thermal expansion coefficient facing the inner side of the arc formed by the cantilever. Finite element methods have been used to optimize the actuator geometry for maximum deflections on TECD actuators about 150 µm long and 50 µm wide, but no deflections larger than 20 µm were obtained. The largest displacements achieved so far with bi-material cantilevers using the TECD mechanism have been obtained by using polymides to coat a ceramic cantilever. This arrangement takes advantage of the large difference in thermal expansion coefficients between the polymide (large α) and the ceramic (small α). Tip deflections up to 50 µm have been obtained in ~300 µm long cantilevers. However, large temperature increases e required in order to achieve them, which imposes demands on designs to reduce thermal losses through conduction. Moreover, because polymers have a relatively low melting temperature, the maximum temperature differential applicable in such devices is limited. Finally, as discussed later, the forces exerted by these polymide-coated cantilevers are relatively small. These facts imply that their usefulness is mainly as sensor devices, not as actuators.

The cantilevered bi-material strip just described can use not just TEDC as the working mechanism but also the shape memory effect or indeed any mechanism that will create a stress between the two layers. While this actually includes the piezoelectric effect, the following will consider only thermally activated mechanisms. Two important performance parameters which should be specified when comparing bi-material cantilever devices of this type is the curvature change produced over a specified temperature change, and the recoverable work per unit volume performed over this temperature interval. Cantilever tip deflections are often quoted for specific devices, but these are a function of cantilever length. Curvature change is independent of length and therefore is a better measure of the obtainable performance for a pair of materials. In the case of interest for microdevice actuators one of the two materials is commonly a relatively thick substrate and the other is a relatively thin film which coats the substrate. Bending of the bi-material cantilever is caused by film stress, whose magnitude ($\sigma_f$) can be estimated from the formula:

$$\sigma_f = \left( \frac{t_s^3 E_s}{6 t_f^2 (1-v_s) R} \right) \frac{1}{1+B}, \quad (1)$$

where $t_f$ is the film thickness and $t_s$, $E_s$, and $v_s$ are the substrate's thickness, Young's modulus, and Poisson's ratio, respectively, while $B=t_f/t_s$ is the thickness ratio between film and substrate.

Equation (1) is a better approximation than the well-known Stoney's formula when film thickness is not negligible in comparison with that of the substrate.

The curvature κ (i.e., the inverse of the radius of curvature) of a bilayered cantilever with rectangular cross section can be calculated from the expression:

$$\kappa \equiv \frac{1}{R} = \frac{6(1+B)^2 \varepsilon}{t[3(1+B)^2 + (1+AB)(B^2+1/AB)]} = \frac{\Gamma \varepsilon}{t}, \quad (2)$$

where $t=t_f+t_s$ is the total thickness of the bilayer, a is the strain (unitless), $B=t_f/t_s$ as defined before, and $A=E'_f/E'_s$ where E' stands for the biaxial modulus of the material, while the function $\Gamma=\Gamma(A,B)$ is implicitly defined. For a cantilever with fixed geometry then, a change in curvature Δκ is proportional to the change in strain Δε, which can be caused by different mechanisms. In the most common situation this is differential thermal expansion, in which case Δε=Δα ΔT, regardless of other considerations such as vibration tolerance, temperature sensitivity (Δκ/ΔT) can be increased by using a pair of materials with higher Δα, maximizing Γ, or—within practical limits—reducing the total cantilever thickness. This approach is adequate if the bi-material cantilever will be used as a thermal sensor. However, if the cantilever will instead be used as an actuator the amount of work it can perform becomes an issue and a different design compromise is needed. The restoring force at the cantilever tip (for rectangular section cantilevers) is proportional to the third power of its thickness. Selection of a pair of materials to maximize Δα implies a simultaneous selection of the elastic moduli, which fixes the A ratio. Since polymers have very low elastic moduli (E ~1 GPa) the restoring force and the work performed in bending, both of which are proportional to the composite cantilever elastic modulus, will be low. Use of stiffer materials will allow exertion of larger forces, but then Δα, and hence Δε, will not be as high. It should be also clear that if (Δκ/ΔT) is small, large curvature changes (and therefore long displacements) may be obtained only by causing large temperature changes in the device. However, this option may not be satisfactory, since hot areas in a microdevice can lead to difficulties with heat transfer to surrounding areas, which can in turn require more complex designs.

SUMMARY OF THE INVENTION

The present invention proposes a novel microactuator apparatus based on the changes in physical properties of materials during a solid-solid phase transition.

According to an aspect of the invention, a microactuator apparatus is provided having at least one substrate material; at least one solid-to-solid phase transition material in contact with said at least one substrate material, wherein said at least one solid-to-solid phase transition material causes at least a portion of said at least one substrate material to move when induced to transition between phases; and transition inducing means configured to selectively control the transition between phases of said solid-to-solid phase transition material.

According to another aspect of the invention, the solid-to-solid phase transition material comprises an insulator-to-metal transition material.

According to still another aspect of the invention, the insulator-to-metal transition material is selected from the group consisting of: $V_2O_3$, $Ti_2O_3$ and VO.

According to yet another aspect of the invention, the insulator-to-metal transition material comprises: $VO_2$.

According to one aspect of the invention, a transition inducing means comprises a heating element selectively heating said solid-to-solid phase transition material.

According to another aspect of the invention, the heating element comprises one of: a heating element in contact with said solid-to-solid phase transition material and a heating element separate from said solid-to-solid phase transition material.

According to a further aspect of the invention, the transition inducing means comprises a light source directed to said solid-to-solid phase transition material.

According to still another aspect of the invention, the transition inducing means comprises a pressure generating means.

According to one aspect of the invention, the solid-to-solid phase transition material is formed into a planar conductor receiving an electrical current.

According to another aspect of the invention, the insulator-to-metal transition material is doped with at least one doping material.

According to a further aspect of the invention, said at least one doping material comprises Tungsten (W).

According to one aspect of the invention, the doped insulator-to-metal transition material comprises: $V_{1-x}W_xO_2$; X is selected from about 0.01 to about 0.02.

According to still another aspect of the invention, the at least one substrate material is selected from the group consisting of: Silicon (Si), Silicon Dioxide ($SiO_2$) and Sapphire.

According to one aspect of the invention, a plurality of solid-to-solid phase transition materials is provided, wherein each one of said plurality of solid-to-solid phase transition materials has a transition temperature different from each other.

According to another aspect of the invention, said plurality of solid-to-solid phase transition materials is positioned on one substrate material.

According to still another aspect of the invention, said plurality of solid-to-solid phase transition materials is positioned on said one substrate material in a stacked multilayer arrangement.

According to yet another aspect of the invention, said plurality of solid-to-solid phase transition materials is longitudinally positioned along said one substrate material in a side-by-side multilayer arrangement.

According to one aspect of the invention, a plurality of separate substrate materials is provided, each one of said separate substrate materials receives at least one of said plurality of solid-to-solid phase transition materials, wherein each one of said plurality of solid-to-solid phase transition materials has a transition temperature different from each other.

According to another aspect of the invention, a microactuator apparatus comprises: a first substrate material and a first solid-to-solid phase transition material in contact with said first substrate material; a second substrate material and a second solid-to-solid phase transition material in contact with said second substrate material, said first substrate material being substantially positioned in parallel with said second substrate material; and transition inducing means configured to selectively control a phase transition of said first solid-to-solid phase transition material and said second solid-to-solid phase transition material so that said first substrate material and said second substrate material selectively move away from each other and close to each other.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

FIGS. 1a-1c illustrate microactuators assemblies according to an embodiment of the present invention.

FIG. 9a illustrates a microactuator assembly according to an embodiment of the present invention.

FIG. 9b illustrates a microactuator assembly according to an embodiment of the present invention.

FIGS. 9c and 9d illustrate a microactuator assembly according to an embodiment of the present invention.

FIG. 10 illustrates a microactuator assembly according to an embodiment of the present invention.

Figure 1B:
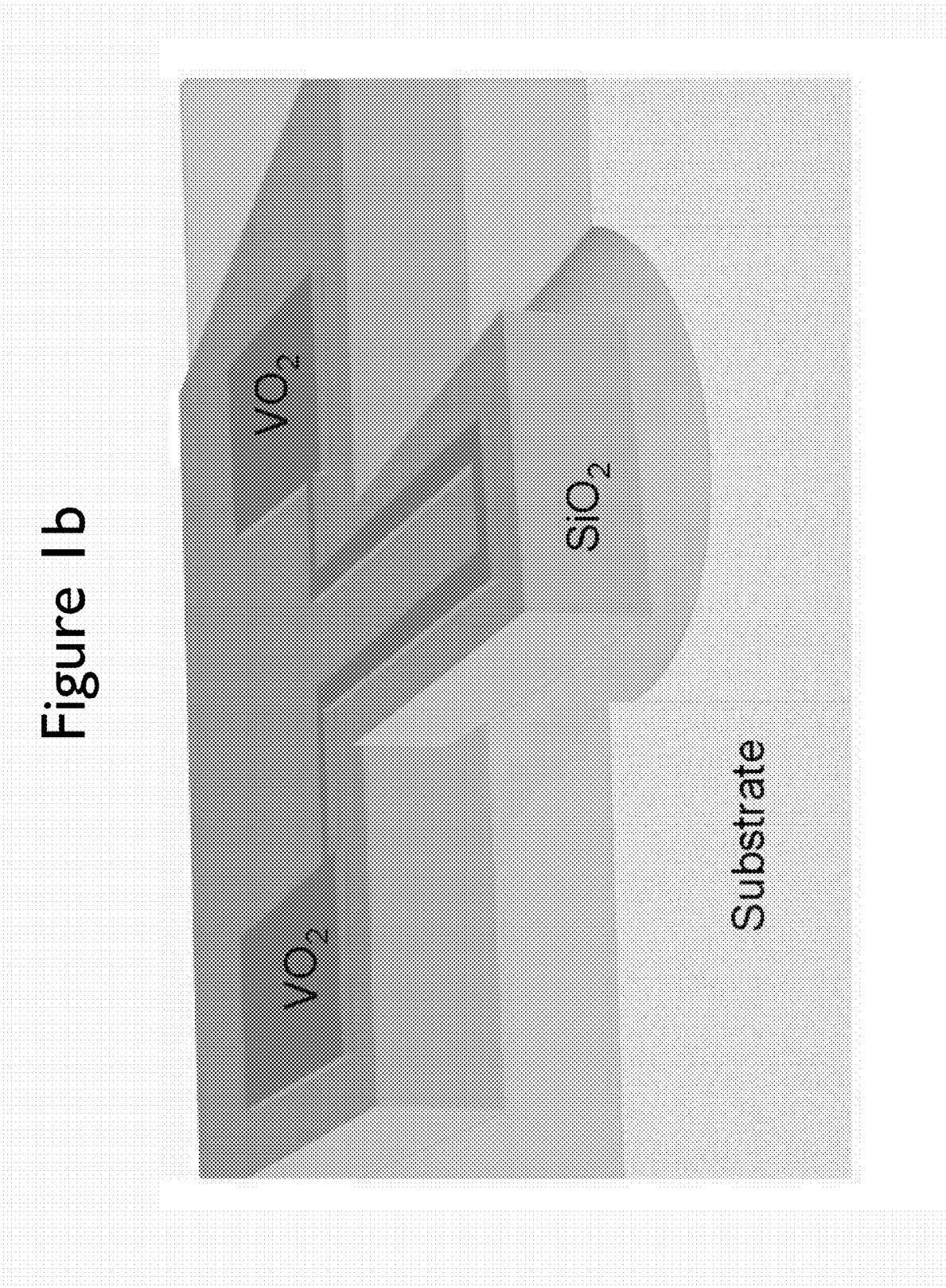

Further features and advantages of the invention will become apparent from the following detailed description taken in conjunction with the accompanying figures showing illustrative embodiments of the invention

DETAILED DESCRIPTION OF THE INVENTION

The present invention consists of an actuation method based on the microstructural changes that occur during a solid-solid phase transformation and in particular those associated with insulator-to-metal transitions (IMTs). Implementations proposed are similar in shape to the bimetallic or bimaterial strips discussed before, but actuation does not rely on stress generated through differential thermal expansion of the two materials, i.e., they are not TECD devices. Instead, the operating mechanism is the stress which develops between two appropriately chosen materials when one of the two undergoes an IMT. In the course of experiments leading to the present invention this stress was found to be much larger than those due to TECD over a comparable temperature increase. These IMTs can occur over a temperature range of just a few degrees for materials in thin-film form. Crucially, as shown in the tests described below, the interfacial stress generated (per degree of temperature change) between an ordinary material and a IMT material over the latter's transition can be orders of magnitude greater than for ordinary bi-material strips. A suitable IMT material for the implementations to be presented here is vanadium dioxide ($VO_2$), as further discussed in the following. However, many other materials which undergo IMTs can be used in the same manner, although the activation temperatures and some response characteristics would in general be different.

The IMT in $VO_2$ has been much studied. The transition process exhibits temperature hysteresis, with a width of ~1 K or less in bulk crystals and at least several degrees in thin films. The IMT is reversible, but bulk crystals frequently crack during cycling through the transition due to the large stresses generated. However, in $VO_2$ thin films, which in practice are polycrystalline, crack formation is forestalled because individual crystals are often not larger than a few microns and actual strains will be lower. Films of this material can be successfully deposited by a variety of techniques, including several which are compatible with large-scale microdevice fabrication procedures.

The exploration that lead to the present invention was motivated by a previous observation by the authors that $VO_2$ coated microcantilevers exhibit a significant change in resonant frequency through the IMT. On further study it was found that very high stresses develop in the film during the transition, which cause substantial bending of the cantilever in this short temperature range.

The IMT in $VO_2$ can be classified as a martensitic transformation, as in SMAs, because it involves an ordered displacement of ions in the crystal structure, and it can be induced either thermally or by applied stress. However, in SMAs the transformation occurs between two phases of a metallic alloy. In contrast, $VO_2$ is a compound with ionic bonding in its low-temperature phase, and as a result it is a hard material. The Meyer Hardness for $VO_2$ in its "insulating" (low-temperature) phase is ~13 GPa, comparable to that of quartz. In the "metallic" (high-temperature) phase the material is more malleable, which already suggests significant property changes between the two phases. Its conductivity in the metallic phase ($\sigma \sim 10^3 \Omega^{-1}$ cm$^{-1}$) originating mainly from vanadium 3d-band electrons, is low compared with simple metals, and becomes four to five orders of magnitude lower still in its insulating phase. Near-infrared transmittance is low in the metallic phase, but increases sharply as the insulating phase is reached. These dramatic property changes are entirely at variance with those observed for SMAs through their corresponding transitions.

The crystal structure of $VO_2$ is tetragonal in its metallic phase (rutile type, designated R). On cooling through the IMT, this changes to a monoclinic phase (designated $M_1$) by slight reordering of the vanadium ions, which causes a doubling of the unit cell. Characteristics through the transition can be greatly affected by doping with other metallic elements, or when the material is nanostructured.

Basic cantilever-type actuators of the type proposed here are depicted in FIGS. 1a-c. They consist of bilayered cantilevers in which the substrate material is any desired solid material and the active coating is a IMT material such as $VO_2$. According to an aspect of the invention as shown in FIG. 1a, a heater element is fabricated on top of the IMT layer. In a second aspect of the invention, as shown in FIG. 1b, the IMT material itself is configured in the shape of a planar conductor so that it can be heated by passing a current through it. FIG. 1c shows an embodiment where no electrical current is used to heat the bi-material cantilever, but it is heated either by a light source focused on the cantilever area, or indirectly, by heat transfer from a physically separate heater. In this last case, heat transfer may be radiant, conductive or convective, or it can be accomplished by a combination of these mechanisms.

In order to prove the concept described before, prototype devices were fabricated and tested. The particular implementation used conforms to the last one described, and heating was achieved by attaching the device to a Peltier-type heater. The details of the fabrication and the tests performed, as well as the results obtained are presented next.

The devices were fabricated by depositing $VO_2$ thin films on commercially available silicon microcantilever chips. The cantilever used for the detailed measurements had length, width and thickness of, respectively, 130, 35, and 1 µm, according to the manufacturer. The quoted typical spring constant was 0.6 N/m. Since the tolerance specified by the manufacturer for the thickness was very high (±30%) and this value was critical for some of the calculations to be performed, the thickness was verified by measuring the first resonant frequency of the bare cantilevers in the chip, prior to film deposition, according to a well-known formula from the theory of cantilever vibrations. Cantilever thickness was found to be 1.04 µm.

Figure 2:
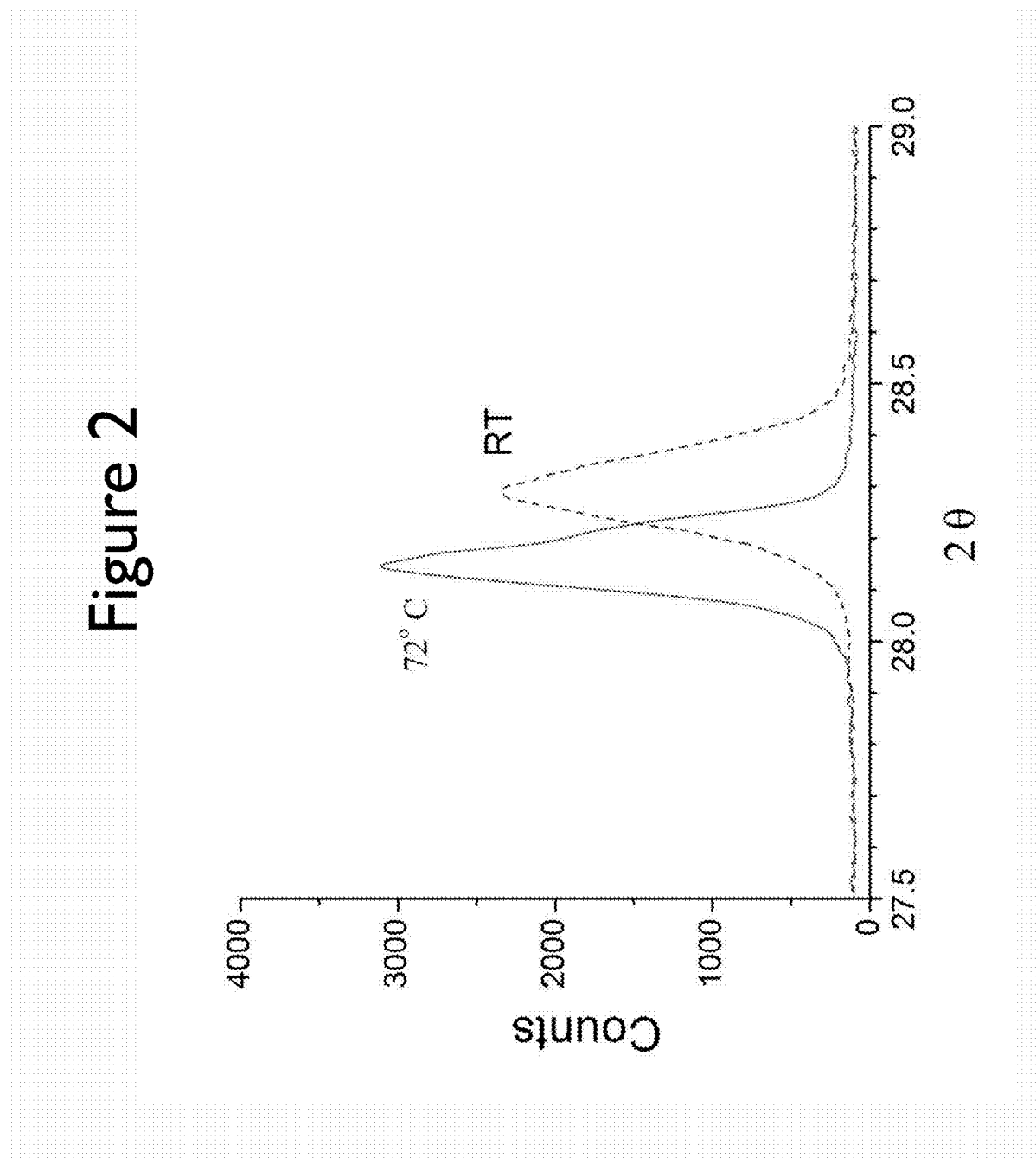
FIG. 2 shows X-ray diffractions plot according to an embodiment of the invention.

The $VO_2$ films were grown by Pulsed Laser Deposition, using the following fabrication conditions. Chamber pressure was 50 mTorr and Ar and $O_2$ gas flows of 10 and 15 sccm, respectively, were maintained. A metallic vanadium target was ablated with KrF excimer laser pulses at a frequency of 10 pps and a fluence at the target of ~4 J/cm$^2$. The target-substrate distance was 5 cm and substrate temperature was kept at 500° C. during deposition. Film thickness was 240 nm, as measured with a stylus profilometer in film steps prepared on the sample by masking a portion of the chip. X-ray diffraction scans of a companion test sample (see FIG. 2) deposited along with the coating on the cantilever chip revealed that the film was strongly oriented with the monoclinic $(011)_M$ planes parallel to the substrate surface. From XRD studies of similar samples it was found that when heated through the IMT the film structure changes to the tetragonal R phase, and it is then the $(110)_R$ planes which are parallel to the surface. This change is completely reversible and can be repeated without any appreciable modification as the sample is thermally cycled through the IMT.

Figure 3:
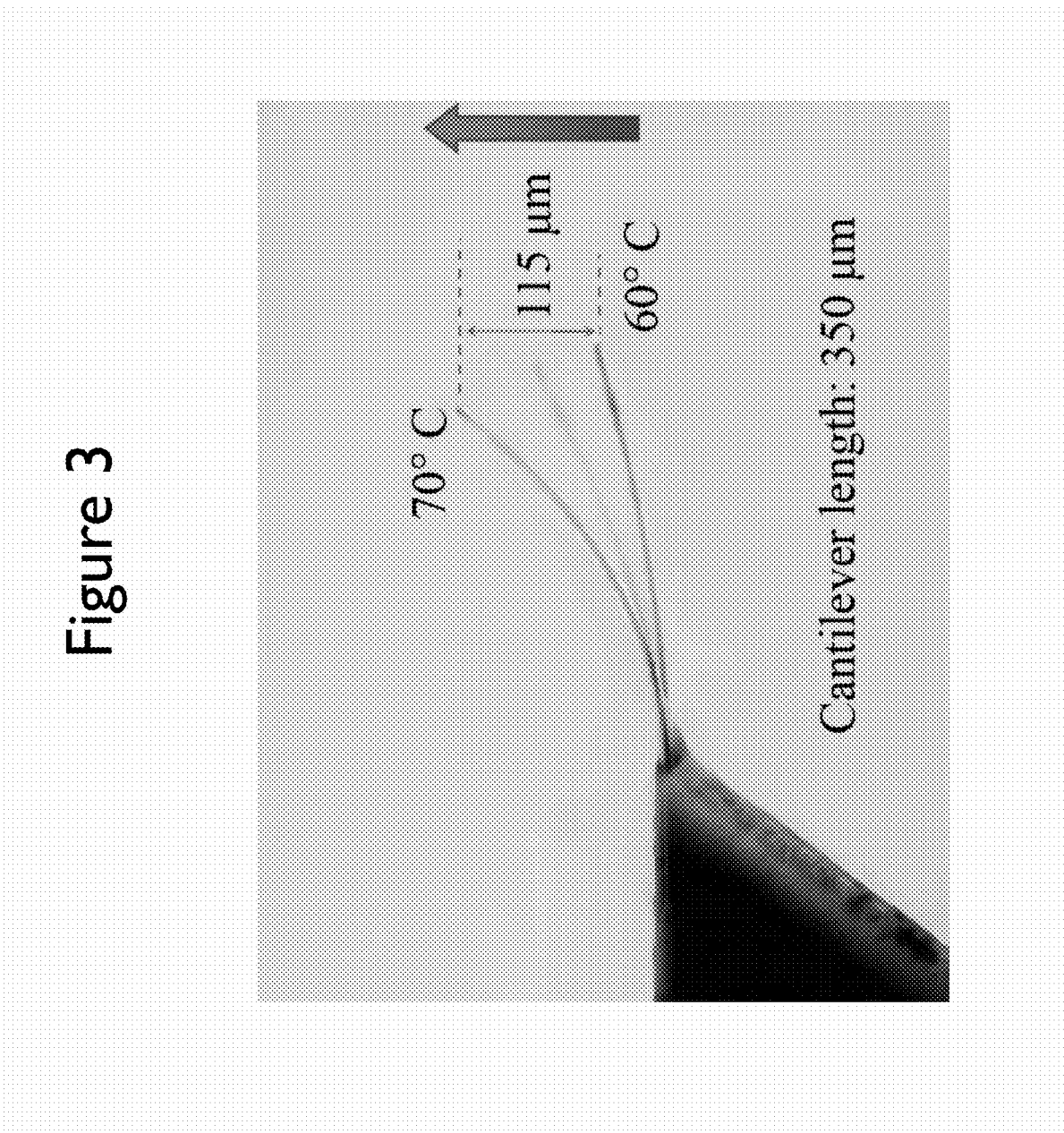
FIG. 3 shows an image of a cantilever assembly bended according to an embodiment of the invention.

The $VO_2$/Si cantilevers exhibited very large changes in curvature over a relatively small temperature range, as shown in the composite image of FIG. 3 for a cantilever which is 350 µm long. The superimposed pictures (one image at each of the three the indicated temperatures) were taken through a low-power microscope as the temperature was raised, which was done using a feedback-controlled heater on which the cantilever chip was attached with silver paint. The temperature was read with a thermocouple attached directly to the chip. At room temperature the cantilever is already curved upwards (i.e., concave towards the side with the deposited film), showing that the film is under tensile stress after fabrication. As the temperature was raised from room temperature, a barely noticeable reduction in curvature was observed. Then, as the IMT region was reached, a rapid and striking increase in curvature occurred, with the cantilever bending upwards. At temperatures past the IMT, again only very small changes were observed. As the temperature was reduced the reverse response was observed, with noticeable hysteresis.

Figure 4:
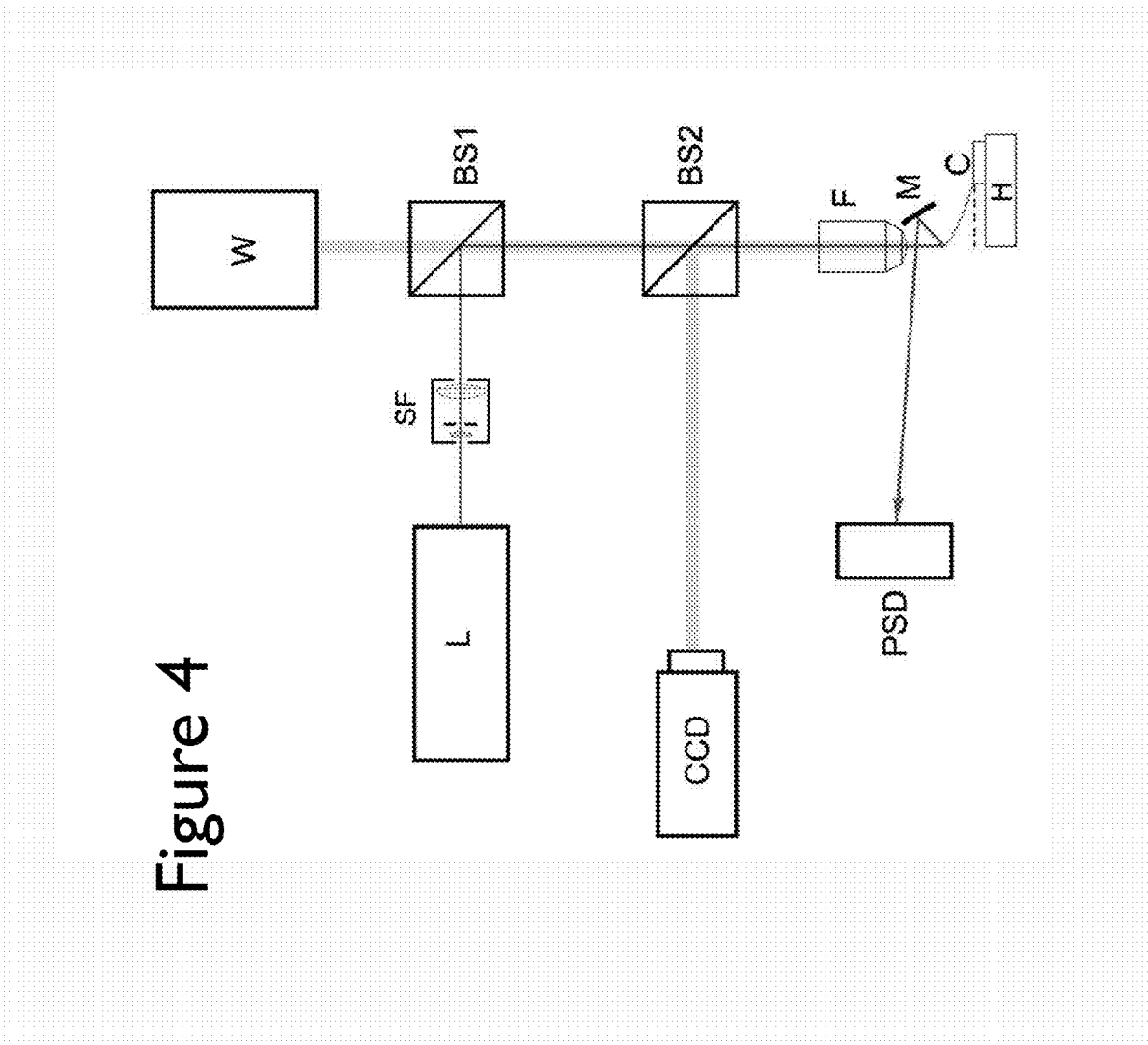
FIG. 4 illustrates a setup system for measuring the changes in curvature according to the invention.

In order to measure these changes in curvature accurately the setup described in FIG. 4 was assembled, which is sufficiently sensitive for the relatively small changes observed at temperatures outside the IMT region, but also has a wide enough operating range to accommodate the large curvature changes trough the IMT. Light from a He—Ne laser is passed through a spatial filter and a beam compressor, in order to have a well-collimated beam with a small diameter. Light from a loosely collimated white light source is combined with the laser beam in the first beamsplitter (BS1). The light passes through an infinity-corrected microscope objective and onto the cantilever chip, so that the laser light is focused to a spot size near the cantilever width and the white light illuminates a much broader area in the chip. The chip is attached to a feedback-controlled heating element and mounted on a multiple-axis precision positioner used to translate and rotate the sample in the focal plane of the lens. The reflected light passing again through the lens is separated from the incoming beams by the second beamsplitter (BS2) and directed to the CCD element of the camera (i.e., without a lens), so that a magnified image of the cantilever ensemble (in white-light) is produced. Both this image and scattered laser light illuminating the area near the cantilever can then be observed in a video screen and adjustments of the chip can be made with the positioner. Laser light incident on the cantilever tip is reflected towards a small mirror, which reflects it in turn towards a position sensitive detector (PSD). The stray white light reaching the PSD is too weak to affect its reading. The PSD is used to record the displacement of the centroid of the reflected laser beam as a function of the cantilever temperature. The folded distance from the cantilever chip plane to the PSD plane was measured with a traveling micrometer. From this data the cantilever displacement $\Delta z$ as a function of temperature was calculated. For convenience, and since only the curvature changes were relevant for the present purpose, the initial radius of curvature was taken to be infinite (straight cantilever) although, as mentioned before, this was certainly not the case.

Figure 5:
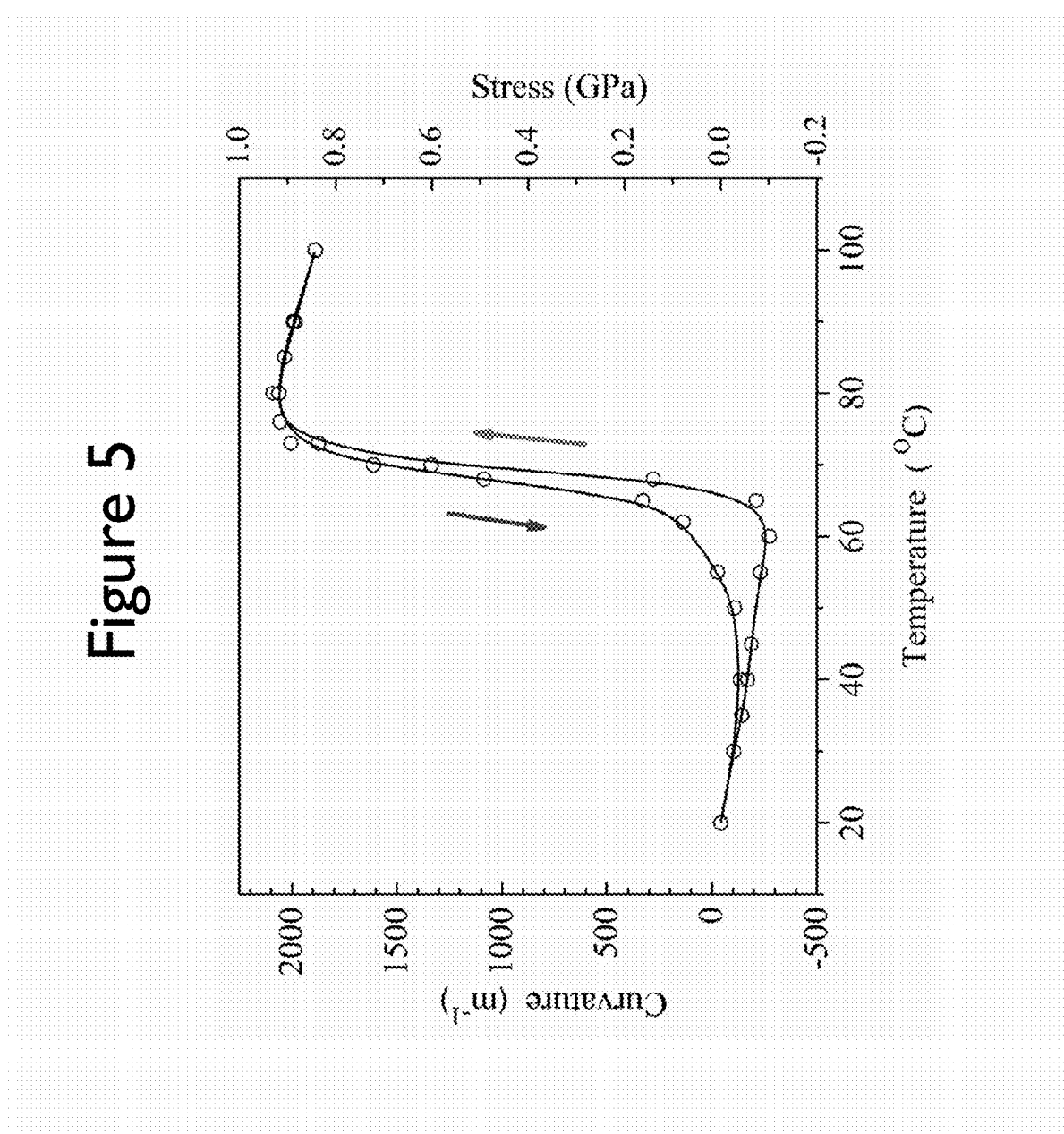
FIG. 5 shows a curvature vs. temperature vs. stress plot according to the invention.

From each tip displacement the corresponding curvature (1/R) was calculated by solving the transcendental equation relating these quantities:

$$\Delta z = 2R\sin^2\left(\frac{L}{2R}\right), \quad (3)$$

where L is the cantilever length. Since it was not true that R>>L for the larger curvatures observed, the small angle approximation commonly employed to simplify this expression was not used for the calculations. The results obtained for a full heating-cooling cycle are presented in the graph in FIG. 5, where the left-hand vertical axis is the curvature in $m^{-1}$. It is noted that a curvature of 2,000 $m^{-1}$ corresponds to R=500 μm, which is less than four times the cantilever length. Repeated heating-cooling cycles produced the same reversible behavior.

Film stress at each temperature was estimated using formula (1), which requires inserting the values of elastic moduli for the substrate. A value of 180.5 GPa was used for $E_s/(1-v_s)$, the biaxial modulus for the substrate, considering that the Si cantilever has surfaces parallel to {100} planes, according to the manufacturer, and that this value is constant for directions within these planes for cubic crystals. The results for calculated stress change are given by the right-hand vertical axis in FIG. 5. The change through the transition represents a recoverable stress of ~1 GPa, an extremely high value. The stress change rate through the IMT was ~0.1 Gpa/K. The hysteresis width is not uniform, but it is less than 3 K at the central region. The results obtained for the $VO_2$/Si cantilevers demonstrate an extremely high rate of change in curvature of up to ~485 $m^{-1}$ per degree near the transition temperature, which is almost an order of magnitude higher than for the best case reported for polymer-coated or SMA-coated cantilevers. The corresponding stress change rate is estimated to be over ~0.1 GPa/K in the transition region. Since the thickness ratio of the cantilevers was not optimized to maximize curvature change, it is likely that even higher rates can be obtained.

It must be emphasized that these extraordinary rates of curvature change are valid only near the transition temperature. Hence, the active element in an actuator based on the principles described here must be brought up to a temperature above the transition temperature in order that actuation is effected. The reverse action is then accomplished simply by cooling the active element to a temperature lower than the transition temperature. The latter can be done either by letting the system cool at its natural rate, or by adopting some form of forced cooling. For the particular case of the $VO_2$-coated cantilever, the preceding means that full actuation will be achieved by bringing the material to a temperature of a few degrees above the transition temperature of 68° C. Furthermore, because the transition can be shifted down substantially by doping with suitable elements (by cation substitution of V with high-valent transition metals such as W or Mo ions), it is possible to design $VO_2$— based actuators which only need to be heated to temperatures 10 or 20° above room temperature to achieve full actuation. Likewise, it is entirely feasible to increase the activation temperature (by cation substitution with low-valent metals such as Al and Cr ions). Unfortunately, controlling the IMT temperature by doping is usually achieved at the cost of a lessened jump in the values of physical characteristics through the IMT.

The performance of work by cantilevers is now considered in more detail. Since the cantilever is an elastic system, neglecting friction losses, the work performed in bending it equals the recoverable work (i.e., stored elastic potential energy). For a single-layer cantilever with rectangular cross-section, thickness t, width w, and length L, the work performed in bending it to a radius of curvature R is (in the small angle approximation)

$$W = \frac{1}{30}\frac{Ewt^3L}{R^2}. \quad (4)$$

(It is noted, however, that if the cantilever is made so wide in relation to its length that it must be considered a "plate", the effective elastic modulus becomes $E/(1-v^2)$ instead of the biaxial modulus). From equation (4), the recoverable work per unit volume in the simple cantilever is then seen to be proportional to the square of its thickness and the square of its curvature, but independent of length or width. While equation (4) is not directly applicable for bilayered cantilevers, it is still useful in order to consider design trade-offs. In a bilayered cantilever actuator the useful curvature change is produced by the controllable stress developed between the layers by any of the mechanisms mentioned before. For a given geometry, the greater the controllable stress change, the greater the work capability. Increasing the thickness of the cantilever would seem to increase the work capability, but this will also rapidly decrease the curvature change which can be caused by the internal stress. A larger value of the effective Young's modulus for the cantilever increases the work capability, but again stiffer materials will bend less for a given stress. Once a pair of materials is selected, which in general will determine the stress which can be developed, the designer can adjust the geometric parameters, including the thickness ratio of the two materials, in order to maximize one of the performance characteristics. Possible design trade-offs are evident. As a rule, neglecting other considerations which might affect the choice of materials, the best choices for bilayered cantilever actuators must provide large controllable stresses and high stiffness.

More generally than through the special case of equation (4), the work per unit volume which can be performed by a cantilever can be calculated from the strain energy density, which is the product $$\tfrac{1}{2}\epsilon\sigma = \tfrac{1}{2}E\epsilon^2, \quad (5)$$

where $\epsilon$ is the strain, as before, and $\sigma$ is the stress generated. For bilayered cantilevers the relevant elastic modulus is the weighted average of the biaxial moduli of the two materials. Then, if the strain change is known the corresponding strain energy density can be calculated.

Because film strain developed during the IMT in $VO_2$-coated cantilevers originates from structural transformation of the coating and over a small temperature change, it is mostly unrelated to the difference in thermal expansion coefficients $\Delta\alpha$ between film and substrate. The maximum strain developed during the transformation can be estimated as follows. Noting that the unit cell crystal of $M_1$ phase $VO_2$ corresponds to two unit cells of the R phase along the monoclinic c direction, and using the unstressed lattice parameters of these two phases, it is readily calculated that twice the volume of the tetrahedral unit cell is slightly larger than that of the monoclinic unit cell (0.32% larger). However, because the film crystal planes parallel to the substrate surface are $(011)_M$ for T<TC but $(110)_R$ for T>TC, the extension of these planes as the IMT is traversed must be considered. From the lattice parameters, the calculated area for the $(011)_m$ and $(110)_R$ planes bounded by, respectively, the monoclinic and doubled tetragonal unit cells along these nearly parallel planes is actually decreased by ~1.7% for a single crystal on heating through the transition. This shows that a substantial strain of up to approximately −0.0083 on heating through the IMT in VO2 is possible in principle.

Since the polycrystalline $VO_2$ film deposited on the Si cantilever for the experiment described before, although well oriented, had no "in plane" texture, the previous result for the strain change cannot be expected to apply directly. The actual strain developed in the experimental case presented can be estimated from the measured $\Delta\kappa$ values using equation (2). Considering the wide range of values given for Young's modulus for $M_1$ phase–$VO_2$, it is reasonable to assume A~1 for $VO_2$/Si, although this must be treated with some caution, particularly since the elastic modulus of $VO_2$ (and hence A) should actually change through the IMT. Using B=0.23 for the thickness ratio, the strain change during the transition is estimated to have been nearly −0.003. While higher strain changes can be produced in other physical situations, it should be noted that this resulted from a temperature change of only ~10 K. Comparing with TECD-driven cantilevers, this is equivalent to $\Delta\alpha=3\times10^{-4}$ $K^{-1}$, a value already higher than for the best bilayer pairs available. Moreover, this performance was obtained from a $VO_2$/Si cantilever which was not optimized for maximal $\Delta\kappa/\Delta T$.

Assuming again that A~1 in order to calculate Γ, the strain energy density for the measured maximum curvature change presented before for the $VO_2$/Si cantilever can be estimated directly using equation (5). The result is ~$8\times10^5$ $J/m^3$. This value is higher than the best current results for TECD-driven cantilevers. Moreover, comparable work/volume characteristic figures can only be obtained with the latter devices by driving them over hundreds of degrees, while in the present case the result corresponds to a temperature increase of just ~10 K. SMA-based cantilevers with better work/volume figures are possible, but it should be noted that the best values known are for free-standing "one-way" SMA actuators, which require a biasing spring for shape recovery, or "two-way" SMA actuators, which have reduced dimensional recovery and require special forming-thermal treatment during fabrication. These requirements are inconvenient for batch processing. Direct application of SMAs in microactuators for integrated devices is more readily accomplished as active layers in bi-material cantilevers, and it is in this particular form that they should be compared both to TECD-driven actuators and to the IMT-driven actuators which are proposed here.

As explained before, the strain-causing mechanism in IMT-driven actuators is essentially the structural change through the IMT. Similarly, the structural change trough the phase transition in a SMA originates the strain. In both cases there are large driving forces associated with the transition. The capacity for work can be estimated by considering the transformation enthalpy or latent heat for each transformation. The latent heat for the $M_1 \rightarrow R$ transition in $VO_2$ is over 51 kJ/kg, which is higher than for typical SMAs, including Ni—Ti (with a value of 20 kJ/kg), so it is clear that the IMT mechanism is energetically more demanding. Therefore, cantilever actuators based on this mechanism can be expected to perform more work per unit volume. Actuators based on this material can exert much higher forces than similar ones of comparable dimensions based on thermal expansion, and likely also than those based on SMAs in similar configurations. While this positive outlook is not necessarily applicable to all IMT materials, it is likely that those exhibiting reversible microstructural arrangements with relatively large associated transformation enthalpies are also good candidates for application in actuators in the same way as described here for $VO_2$.

The foregoing does not mean that all the heat energy required for the IMT corresponds to energy available for the performance of work by the cantilever. Instead, the latter is just a small fraction of the input heat. Neglecting all heat losses and the energy required to heat the silicon substrate itself in the cantilever, the elastic work performed on the $VO_2$/Si cantilever in the experiment described above (and therefore in principle recoverable) was equivalent to ~1.8% of the heat absorbed to produce the phase transition in the $VO_2$ film. But while transition-driven thermal actuators are not thermodynamically efficient, they can still be useful in low grade energy harvesting devices because they can operate between sources and sinks near ambient temperatures and with a small differential (of just ~10 K or less for $VO_2$).

The very large curvature changes obtained over a small temperature change suggest that thermally activated actuators incorporating IMT materials and with micron or submicron lengths can offer controllable motions with nanometer resolution and would be able to apply large forces. While these capabilities can be obtained from piezoelectric microdevices, thermally activated ones would be much simpler to fabricate and operate. Considering the hardness and stiffness of the material, operational frequency—which is very low in thermally activated devices in comparison with piezoelectrics, for example—can be expected to be high. The dramatic changes in electronic and optical properties of $VO_2$ through the IMT can be employed to add functionality in novel electromechanical or optomechanical microdevices.

The invention has been described above in a basic configuration consisting of a rectangular cantilever structure that can be heated in different ways as previously explained. However, instead of a rectangular cantilever shape, the actuator can have any other shapes known in the art, such as spirals, which allow for increased deformation during actuation, or those which produce motion in particular directions or locations in the structure, such as discs, bridges, etc.

Since the mechanism described for actuation in this invention is based on the structural changes caused by the phase transition in the IMT material, different crystal orientations can cause different responses, including bending in the opposite direction as that observed for the $VO_2$/Si cantilevers described. This can be used for design of actuators operating on the same principle, but with other response characteristics. For example, different growth conditions or different substrate materials can cause $VO_2$ to grow with other crystal orientations with respect to the substrate surface. As a particular case, for films grown on c-cut sapphire ((001) plane surface), the $VO_2$ (010) plane is parallel to the $Al_2O_3$ (001). This means that the response of a $VO_2$/c-cut sapphire cantilever will depend on expansion or contraction of the $VO_2$ (010) plane as the IMT is traversed, not that of the (110) plane as for the case of $VO_2$/(001) Si. Instead of $VO_2$, other materials that undergo IMTs can be substituted. The main changes of this substitution will be that (i) the transformation temperature will be different, and (ii) the bending response through the IMT, in terms of sign and magnitude, will depend on the characteristic crystallographic orientation of the chosen material over the particular substrate used. For example, $V_2O_3$ could be substituted, with a IMT near 168 K, or $Ti_2O_3$, with a IMT near 475 K. Many IMT materials are known, although they have been less studied than $VO_2$. This possibility extends the operational range of the type of actuators described to temperatures which would not be practical for the use of $VO_2$ or its alloys, nor for competing SMAs.

Alternatively, the actuators described can be activated by applying pressure instead of thermally. This is due to the fact that IMTs can be produced by changes in pressure as well as by heating or cooling. For example, it is well known that the transition temperature in $VO_2$ is a function of pressure. A hydrostatic pressure change can be most conveniently applied by enclosing the device in a sealed chamber so that the pressure of the surrounding air (or any suitable gas) can be controlled by an external pneumatic system. The same concept can be extended to an actuator of this type immersed in a liquid, since the pressure can be likewise controlled by an external hydraulic system. An advantage of this manner of actuating the device is that the temperature can remain constant, since there is no need to heat the actuator. In particular the option of operating the device inside a liquid is a clear advantage over purely thermal actuators because heat transfer is much more effective in liquids than in gases. On the other hand, relatively high pressures will be needed to actuate the device in this manner, so that thermal activation is the preferred mode of operation.

Figure 6:
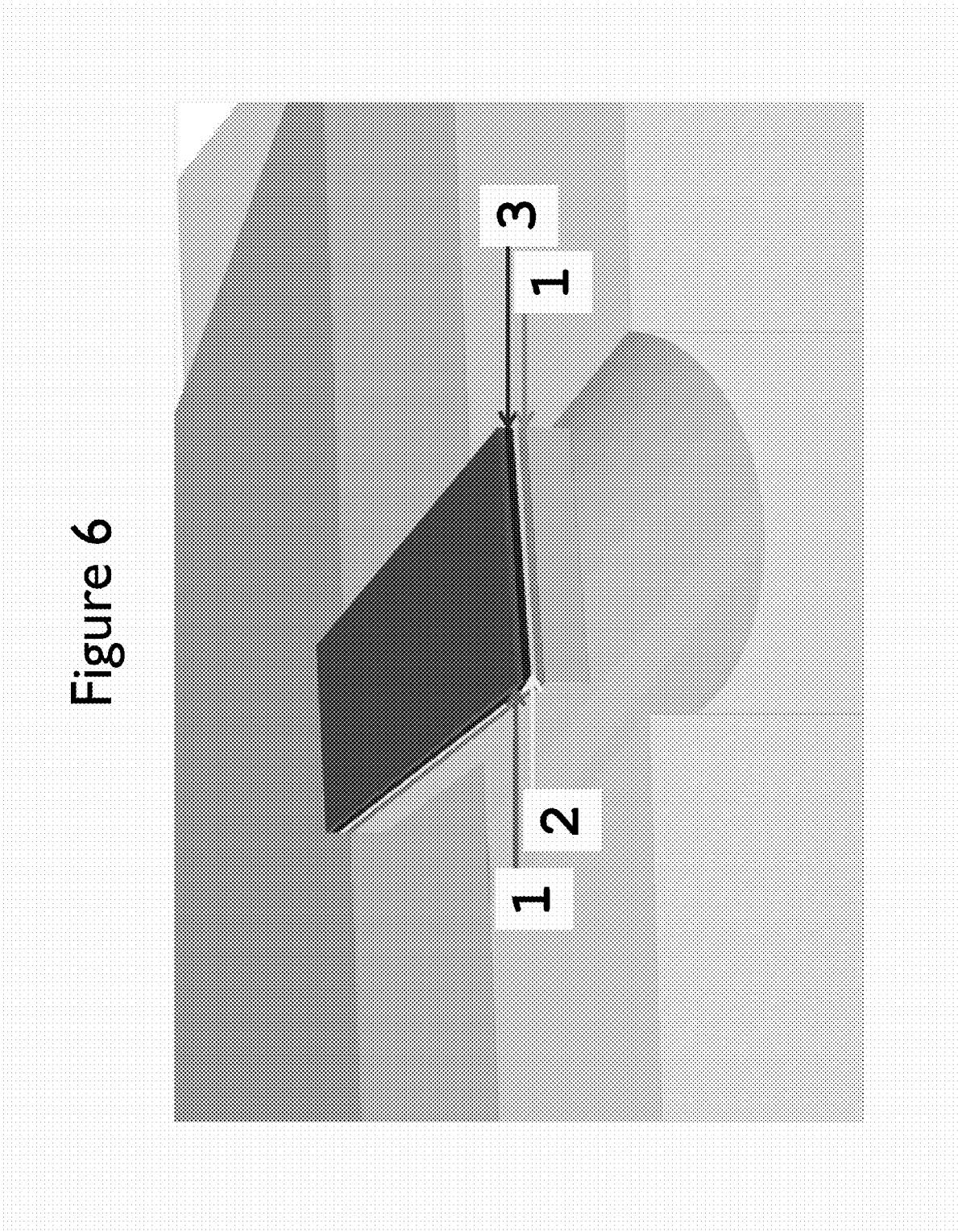
FIG. 6 illustrates a microactuator assembly according to an embodiment of the present invention.
Figure 7:
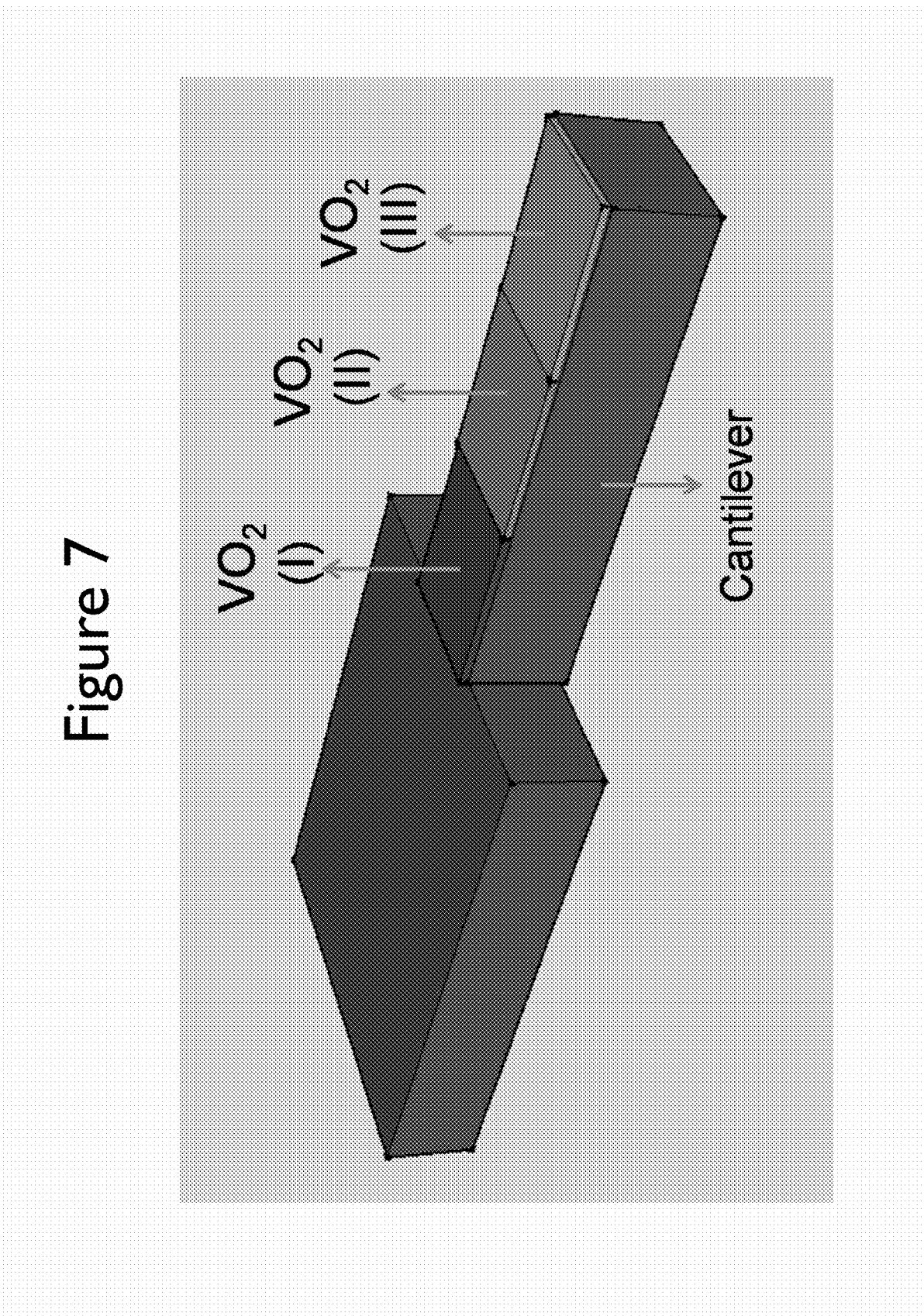
FIG. 7 illustrates a multi-microactuator assembly according to an embodiment of the present invention.
Figure 8:
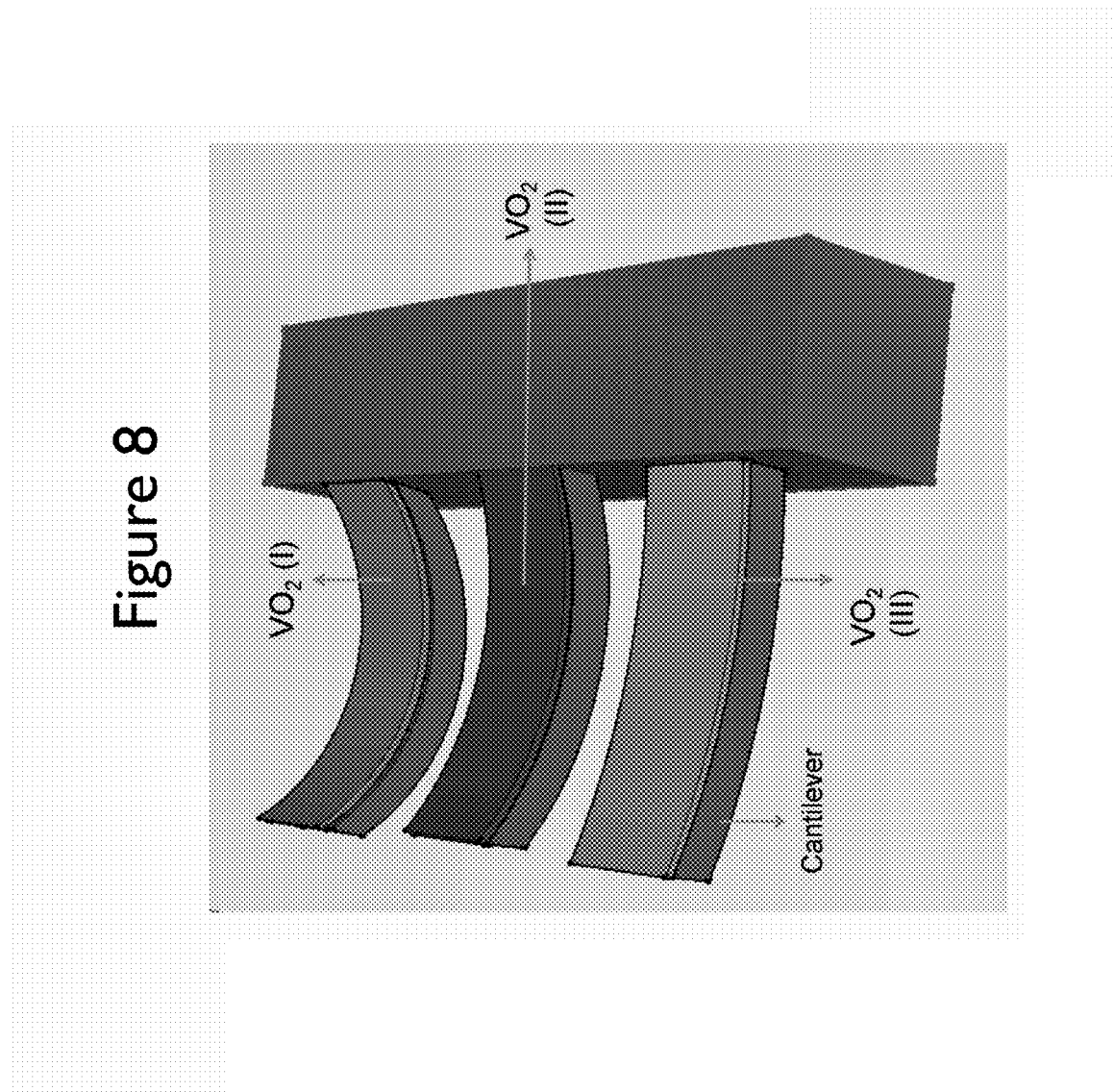
FIG. 8 illustrates a multi-microactuator assembly according to an embodiment of the present invention.

According to an embodiment of the invention, a multilayered or sequentially layered cantilever incorporating two or more IMT materials having different transition temperatures (f.i.: $T1<T2<T3$) is provided. Since the actuating mechanism is effective only through the IMT region, this means that each layer will act in sequence as the temperature is raised and passes through the IMT of each of the materials (f.i., first T1, then T2, and finally T3 during heating). The inverse sequence will occur during cooling. FIG. 6 and FIG. 7 illustrate these configurations, respectively, for multilayered and sequentially layered cantilevers. One simple way of producing the IMT materials with different required transition temperatures is by doping with different concentrations of elements which cause it to be lowered or raised, as explained before for $VO_2$. Relatively complex operations requiring a fixed sequence of motions in several actuators in a single chip can be achieved without the need for control of individual actuators. Instead, different actuators can be fabricated with different IMT material compositions so that transition temperatures are in a particular desired sequence. Then, actuation in this sequence can be effected simply and automatically by raising the temperature of the complete chip (for example with an external heater), so that as the temperature is raised for the chip each of the individual actuators will move at its predetermined activation temperature. This embodiment is illustrated in FIG. 8, but it is emphasized that the type of actions performed can be very complex, including motions in different directions, to make or unmake electrical contacts, or to advance levers in different directions at different times. In this type of "pre-programmed" device the sequence of actions cannot be "unlearned", so it is less flexible than standard actuator arrays which can be individually addressed. On the other hand there is no need for any wiring to individually control each actuator, so that simplicity of operation and the possibility of reduced total area can provide substantial advantages for repetitive operations.

According to another aspect of the invention, the cantilever actuators described are also designing for lateral motion, so that the cantilever arm moves in a direction parallel to the substrate surface instead of perpendicular to it. This embodiment will require special arrangements for film deposition, but these are within the capabilities of current technology. What is required is for the IMT film to be deposited on one lateral side only of the substrate cantilever, which for this purpose has been shaped in a narrow and deep beam, as illustrated in FIG. 9*a*. Because the cantilever is thicker than wider, it will have a much lower spring constant in the direction parallel to the substrate plane. The film is then deposited on one side of the cantilever, as shown in FIG. 9*b*. This can be accomplished using a technique which produces a highly directional beam of effluents, such as Pulsed Laser Deposition, and in a configuration in which the beam of effluents is approximately perpendicular to the surface to be coated. In order to prevent film growth on the top side of the structure, it may be covered prior to the deposition process by a photoresist layer which can be stripped afterwards. Once fabricated, this actuator can be operated by heating, as illustrated in FIG. 9*c*.

As an extension of this, two closely spaced cantilevers can be fabricated and the outer surfaces coated in the manner described before. Thermal activation will open the tweezers wide (since both would bend outwards) as soon as the transition temperature is reached (FIG. 9*d*). As soon as the temperature is lowered slightly below they will close tightly. Thus, it can work as a set of "micro-tweezers" which can be much smaller and simpler to fabricate than current similar state-of-the-art devices. This structure can be heated most simply with a light source, or via current flow in a slightly more complex design. The substrate cantilever could also be shaped in other ways so that it presents a greater area for a surface at a particular angle ($\phi \neq 0$) with respect to the substrate surface, which can then be coated with the IMT film (FIG. 10). Since the inclined actuator motion is perpendicular to this surface, it can be engineered to move in any desired direction, not just perpendicular to the substrate plane. Bi-stable operation of the IMT-based actuators is feasible. Because the width of the hysteresis curve in $VO_2$ can be greatly increased for nanocrystalline material, it is possible to design actuators as described before, but with the ability to maintain one of two positions at the same temperature. This would be of interest particularly at room temperature, because either of the two actuator positions could then be maintained without application of power. The latter may require the use of $VO_2$ doped with a high valent metal (e.g., Mo, W) in order to achieve the IMT near room temperature.

Another implementation which takes advantage of the multifunctionality of the VO2 coating uses its change of resistance through the IMT to sense the state of the actuator. This is feasible because the mechanical and electrical changes in the material have the same origin and take place simultaneously, which makes it a "smart" material. Because resistivity change for the IMT is so large, detection would be very simple and the actuator will be self-referencing. The resistance will be sensed most conveniently if the actuator is heated by current passed through the $VO_2$ itself (as shown before in FIG. 1*b*). It is also possible to sense the state of the actuator by detecting the intensity of a beam of IR light reflected or transmitted through it, due to the large change in optical properties of $VO_2$ in the near IR range as the IMT occurs. Use of transmitted light would require a substrate that is transparent at the wavelength of the light used to monitor the device. The latter means that silicon would be an adequate substrate for this purpose.

It is also feasible to add a piezoelectric layer to the cantilever or similar structure so that the large stress generated by the $VO_2$ during its transition generates a piezoelectric voltage which can be conveniently tapped by electrodes deposited on the piezoelectric material. In this way, heat absorption by the cantilever structure will cause bending, which in turn will result in stress or pressure being applied to the piezoelectric. The voltage generated by the piezoelectric can then be used to drive microcircuits connected to it. The piezoelectric layer can be included in the cantilever itself, so that the generated stress acts directly on it, or in a separate structure, placed so that force exerted by the tip of the $VO_2$-coated cantilever is applied on the piezoelectric-coated structure.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. A microactuator apparatus comprising:
   at least one substrate material;
   at least one solid-to-solid phase transition material in contact with said at least one substrate material, wherein said at least one solid-to-solid phase transition material causes at least a portion of said at least one substrate material to move when induced to transition between phases; and
   transition inducing means configured to selectively control the transition between phases of said solid-to-solid phase transition material.

2. The microactuator apparatus of claim 1, wherein said solid-to-solid phase transition material comprises an insulator-to-metal transition material.

3. The microactuator apparatus of claim 2, wherein said insulator-to-metal transition material is selected from the group consisting of: $V_2O_3$, $Ti_2O_3$ and VO.

4. The microactuator apparatus of claim 2, wherein said insulator-to-metal transition material comprises: $VO_2$.

5. The microactuator apparatus of claim 1, wherein said transition inducing means comprises a heating element selectively heating said solid-to-solid phase transition material.

6. The microactuator apparatus of claim 5, wherein said heating element comprises one of: a heating element in contact with said solid-to-solid phase transition material and a heating element separate from said solid-to-solid phase transition material.

7. The microactuator apparatus of claim 1, wherein said transition inducing means comprises a light source directed to said solid-to-solid phase transition material.

8. The microactuator apparatus of claim 1, wherein said transition inducing means comprises a pressure generating means.

9. The microactuator apparatus of claim 1, wherein said solid-to-solid phase transition material is formed into a planar conductor receiving an electrical current.

10. The microactuator apparatus of claim 1, wherein said insulator-to-metal transition material is doped with at least one doping material.

11. The microactuator apparatus of claim 10, wherein said at least one doping material comprises Tungsten (W).

12. The microactuator apparatus of claim 10, wherein said doped insulator-to-metal transition material comprises: $V_{1-x}W_xO_2$; X is selected from about 0.01 to about 0.02.

13. The microactuator apparatus of claim 1, wherein said at least one substrate material is selected from the group consisting of: Silicon (Si), Silicon Dioxide ($SiO_2$) and Sapphire.

14. The microactuator apparatus of claim 1, comprising a plurality of solid-to-solid phase transition materials, wherein each one of said plurality of solid-to-solid phase transition materials has a transition temperature different from each other.

15. The microactuator apparatus of claim 14, wherein said plurality of solid-to-solid phase transition materials is positioned on one substrate material.

16. The microactuator apparatus of claim 15, wherein said plurality of solid-to-solid phase transition materials is positioned on said one substrate material in a stacked multilayer arrangement.

17. The microactuator apparatus of claim 15, wherein said plurality of solid-to-solid phase transition materials is longitudinally positioned along said one substrate material in a side-by-side multilayer arrangement.

18. The microactuator apparatus of claim 1, further comprising a plurality of separate substrate materials, each one of said separate substrate materials receives at least one of said plurality of solid-to-solid phase transition materials, wherein each one of said plurality of solid-to-solid phase transition materials has a transition temperature different from each other.

19. A microactuator apparatus comprising:
   a first substrate material and a first solid-to-solid phase transition material in contact with said first substrate material;
   a second substrate material and a second solid-to-solid phase transition material in contact with said second substrate material, said first substrate material being substantially positioned in parallel with said second substrate material; and
   transition inducing means configured to selectively control a phase transition of said first solid-to-solid phase transition material and said second solid-to-solid phase transition material so that said first substrate material and said second substrate material selectively move away from each other and close to each other.

* * * * *